United States Patent
Yoshida et al.

(10) Patent No.: US 8,291,304 B2
(45) Date of Patent: Oct. 16, 2012

(54) SIGNAL PROCESSING DEVICE, SIGNAL PROCESSING METHOD, AND SIGNAL REPRODUCING APPARATUS

(75) Inventors: Kenji Yoshida, Akishima (JP); Haruka Obata, Yokohama (JP); Kohsuke Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/088,957

(22) Filed: Apr. 18, 2011

(65) Prior Publication Data

US 2011/0264983 A1    Oct. 27, 2011

(30) Foreign Application Priority Data

Apr. 21, 2010 (JP) ................................ 2010-098187

(51) Int. Cl.
*H03M 13/03* (2006.01)
(52) U.S. Cl. ...................................................... 714/795
(58) Field of Classification Search .................. 714/746, 714/786, 795, 800–801
See application file for complete search history.

(56) References Cited

U.S. PATENT DOCUMENTS

| | | | | |
|---|---|---|---|---|
| 5,729,517 | A * | 3/1998 | Fujiwara et al. | 369/59.22 |
| 7,050,491 | B2 * | 5/2006 | McDonald et al. | 375/232 |
| 7,978,792 | B2 * | 7/2011 | Maruyama et al. | 375/341 |
| 2009/0129229 | A1 * | 5/2009 | Park et al. | 369/59.22 |

FOREIGN PATENT DOCUMENTS

| | | |
|---|---|---|
| JP | 04-182968 A | 6/1992 |
| JP | 2830806 A | 6/1997 |
| JP | 10-011913 A | 1/1998 |
| JP | 2002-015530 | 1/2002 |
| JP | 2002-367291 | 12/2002 |
| JP | 2006-121285 A | 5/2006 |

OTHER PUBLICATIONS

Japanese Office Action dated Jul. 5, 2011, filed in Japanese counterpart Application No. 2010-098187, 6 pages (with English translation).

Japanese Office Action dated Sep. 27, 2011, filed in Japanese counterpart Application No. 2010-098187, 7 pages (with English translation).

* cited by examiner

*Primary Examiner* — Shelly A Chase
(74) *Attorney, Agent, or Firm* — Patterson & Sheridan, LLP

(57) ABSTRACT

According to one embodiment, a signal processing device comprises a first waveform equalizer, a second waveform equalizer, a first Viterbi decoder, a second Viterbi decoder. The first and the second waveform equalizers equalize a waveform of the input signal according to first and second partial response characteristics and output first and second partial response signals. The first and second Viterbi decoders decode the first and the second partial response signals by means of Viterbi decoding process. The input signal is reproduced based on an output of the first Viterbi decoder and an output of the second Viterbi decoder.

18 Claims, 7 Drawing Sheets

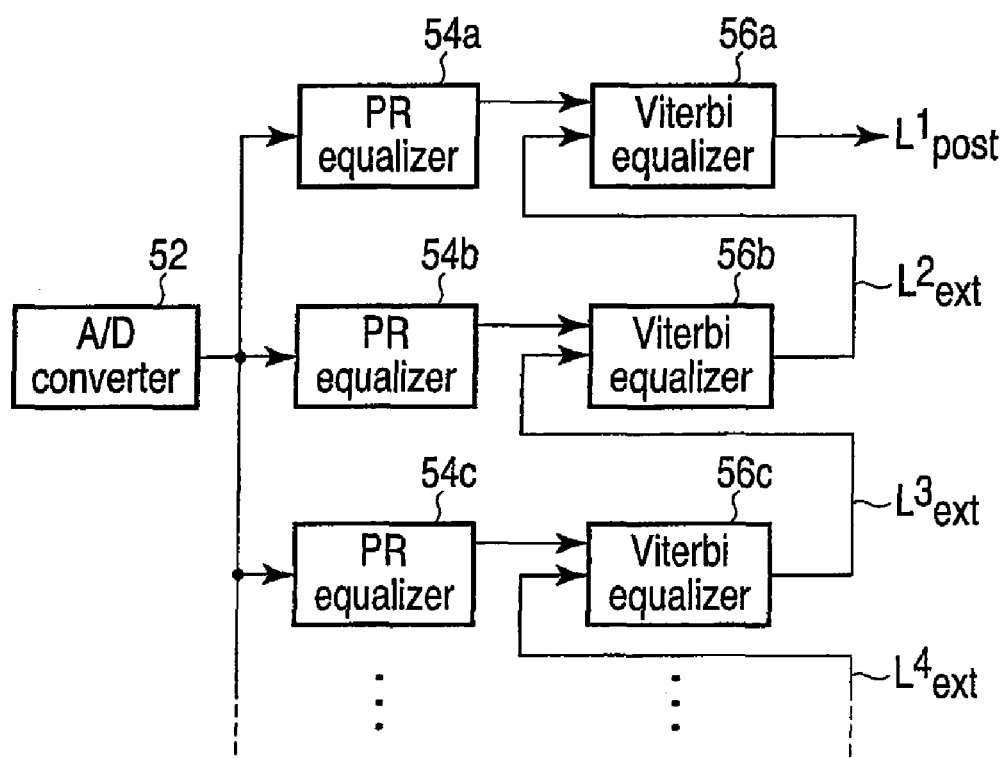
F I G. 12

SIGNAL PROCESSING DEVICE, SIGNAL PROCESSING METHOD, AND SIGNAL REPRODUCING APPARATUS

CROSS-REFERENCE TO RELATED APPLICATIONS

This application is based upon and claims the benefit of priority from Japanese Patent Application No. 2010-098187, filed Apr. 21, 2010; the entire contents of which are incorporated herein by reference.

FIELD

Embodiments described herein relate generally to a recording/reproducing apparatus such as a hard disk drive and a DVD drive or a reception apparatus for decoding a transmission signal, and to a signal processing device and signal processing method used for these apparatuses.

BACKGROUND

A high-density recording is achieved in a recording/reproducing apparatus such as a hard disk drive, a CD drive, a DVD drive, and a BD drive. The recording/reproducing apparatus employs a Partial Response Maximum Likelihood (PRML) signal processing scheme.

In a conventional recording/reproducing apparatus, a binarizing scheme for a reproduced signal, a waveform slice scheme is employed. In the waveform slice scheme, binarization is performed depending on whether amplitude of a reproduced signal is higher or lower than a threshold level. However, since the amplitude of the reproduced signal decreases due to high-density recording, a large number of identification errors occur in the binarization performed by the waveform slice scheme. It is known that the PRML signal processing scheme can obtain a higher signal quality than that in a conventional level slice scheme, even in information recorded with a high density.

In the PRML signal processing scheme, through a PR equalizer, an input signal is supplied to a Viterbi equalizer, and a decoding signal is output from the Viterbi equalizer. The Viterbi equalizer cumulatively sums errors between actual input signals at sample points and all supposed paths and selects a path having a minimum cumulative sum. A bit string corresponding to the selected path is output as a decoded signal. In the PRML signal processing scheme, the accuracy of decoding is determined according to what kind of partial response the PR equalizer equalizes the input signal to.

In the past, an apparatus has been developed, in which a reproduced signal is supplied to a plurality of PR equalizers, which equalize the reproduced signal to a plurality of partial response signals. Then, the plurality of obtained partial response signals are weighted with an appropriate ratio and are added up, and the obtained partial response signal is input to a Viterbi equalizer. However, this apparatus includes a small effect for improving a characteristic (bit-error rate). This apparatus simply derives one metric from the plurality of PR targets and performs Viterbi equalization. Therefore, even an apparatus for equalizing one PR target can obtain substantially the same degree of characteristic (bit-error rate) as this apparatus when a tap coefficient of an FIR filter constituting a PR equalizer is selected appropriately.

It should be noted that a reception apparatus for decoding a transmission signal may sometimes employ PRML signal processing scheme, and in such case, the same phenomenon occurs.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 12 is an exemplary chart illustrating a reproduced signal processing circuit according to a third modification of the second embodiment.

DETAILED DESCRIPTION

Various embodiments will be described hereinafter with reference to the accompanying drawings. In general, according to one embodiment, a signal processing device comprises a first waveform equalizer, a second waveform equalizer, a first Viterbi decoder, a second Viterbi decoder. The first and the second waveform equalizers equalize a waveform of the input signal according to first and second partial response characteristics and output first and second partial response signals. The first and second Viterbi decoders decode the first and the second partial response signals by means of Viterbi decoding process. The input signal is reproduced based on an output of the first Viterbi decoder and an output of the second Viterbi decoder.

First Embodiment

Figure 1:
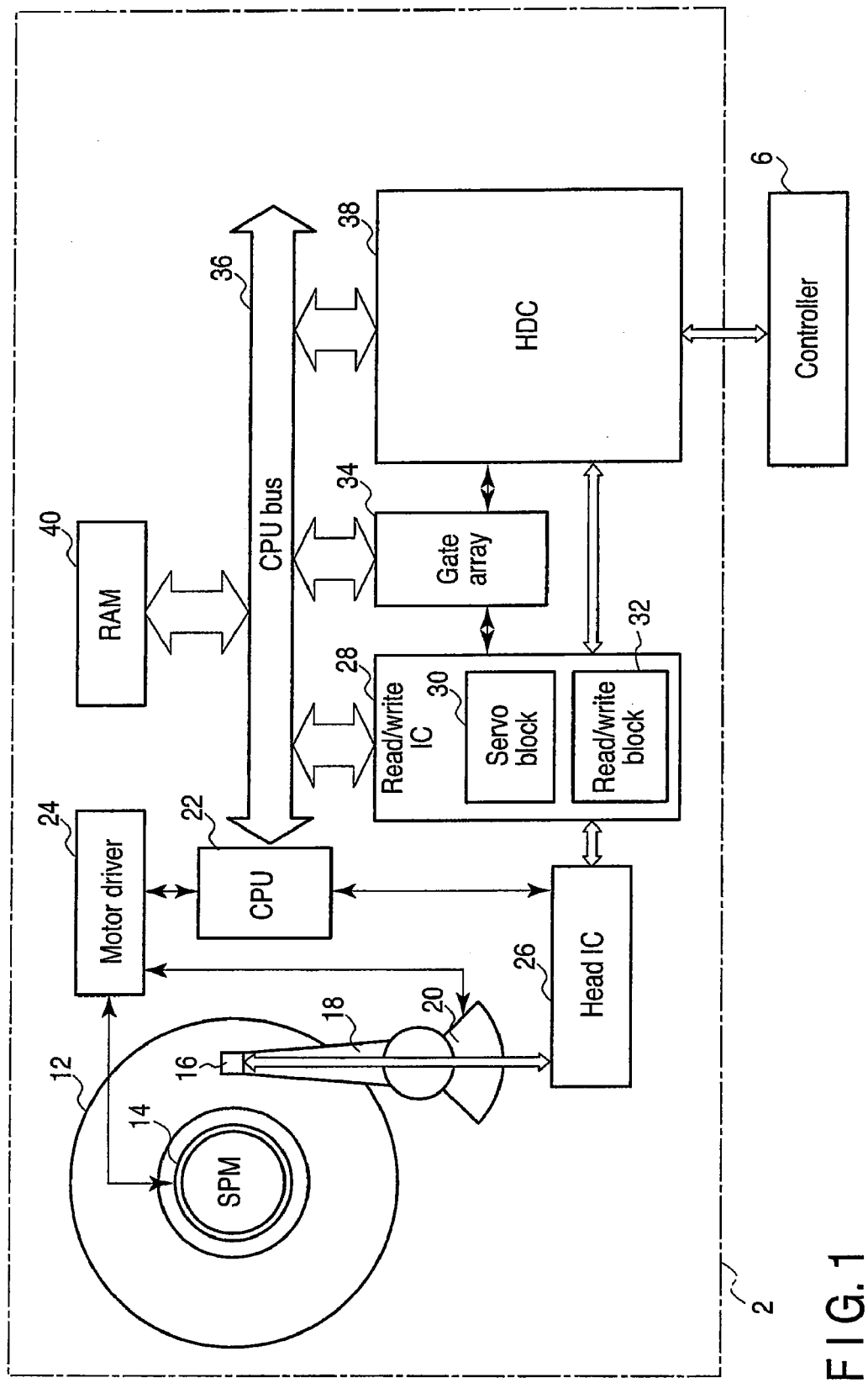
FIG. 1 is an exemplary chart illustrating a circuit configuration of a hard disk drive according to a first embodiment.

FIG. 1 is an exemplary chart illustrating a circuit configuration illustrating a hard disk drive (HDD) 2 according to the first embodiment. The HDD 2 is a storage device for writing data (including error correction encoded data) to a recording surface of a disk (magnetic disk) 12 or reading data from the recording surface in response to a read/write request from a controller 6 serving as a host system.

The disk 12 is fixed to a spindle motor (SPM) 14, and the SPM 14 drives and rotates the disk 12 at a constant velocity. For example, one surface of the disk 12 is formed as a recording surface for magnetically recording data. A head (magnetic head) 16 is provided to face the recording surface of the disk 12. The head 16 is fixed at one end of an actuator 18. The other end of the actuator 18 is fixed to a voice coil motor (VCM) 20. The VCM 20 drives the head 16 to move in an area overlapping the surface of the disk 12 in a circular arc about the axis of the VCM 20.

In the configuration of FIG. 1, the HDD 2 having the single disk 12 is illustrated. However, multiple disks 12 may be fixed to the SPM 14 with certain spaces therebetween. In this case, multiple actuators 18 are fixed to the VCM 20 in such a manner that the actuators 18 are fitted in the spaces between the multiple disks 12 in an overlapping manner. A head 16 is fixed to one end of each actuator 18. Therefore, the SPM 14 drives and rotates all disks 12 simultaneously. When the VCM 20 drives the disks 12, all heads 16 are simultaneously moved. Further, in the configuration shown in FIG. 1, one surface of the disk 12 forms a recording surface. However, recording surfaces may be formed on both surfaces of the disk 12, and the head 16 may be provided facing each recording surface.

The CPU 22 functions as a main controller for the HDD 2. The CPU 22 starts, stops, and controls the SPM 14 to keep the rotation speed, through a motor driver 24. The CPU 22 also drives and controls the VCM 20 through the motor driver 24, thereby moving the head 16 to a target track, and positioning the head 16 within a predetermined adjacent area of the target track.

A positioning of the head 16 is performed in the stable rotation state after the SPM 14 is actuated. Servo areas, not shown, are provided in the circumferential direction of the disk 12 with equal intervals. Therefore, servo signals recorded in the servo areas appear with the same time intervals in the analog signal read from the disk 12 by the head 16 and amplified by a head IC 26. A read/write IC 28 (a servo block 30 included in the read/write IC 28) and a gate array 34 generate a signal for positioning the head 16 by processing the above analog signal by using this characteristic of the servo signals. The CPU 22 causes the motor driver 24 to supply the VCM 20 with a current (VCM current) for positioning the head 16 in real time by controlling the motor driver 24 based on the above positioning signal.

As described above, while the CPU 22 controls the SPM 14 and VCM 20 through the motor driver 24, the CPU 22 controls other elements in the HDD 2, and processes commands. The CPU 22 is connected to a CPU bus 36.

The CPU bus 36 is connected to the read/write IC 28, the gate array 34, a disk controller (HDC) 38, and a RAM 40. For example, the RAM 40 is used to store various variables used by the CPU 22. A part of the storage area of the RAM 40 is used as a work area for the CPU 22.

The read/write IC 28 includes the servo block 30 and a read/write block 32. The servo block 30 performs signal processing necessary for positioning the head 16, including extraction of a servo signal. The read/write block 32 performs signal processing (including error correction encoding processing and decoding processing) for reading data and writing data. The gate array 34 generates signals for control, including a signal for the extraction of the servo signal by the servo block 30.

The HDC 38 is connected to not only the CPU bus 36 but also the read/write IC 28 and the gate array 34. The HDC 38 includes a host interface control function, which receives commands (write and read commands, etc.) from the controller 6, and controls the data transfer between the host system (the controller 6) and the HDC 38.

Each of the read/write IC 28, the gate array 34, and the HDC 38 includes a register for control. These registers for control are assigned to respective parts of the memory space of the CPU 22. By accessing these parts, the CPU 22 controls the read/write IC 28, the gate array 34, and the HDC 38 through the registers for control.

Figure 2:
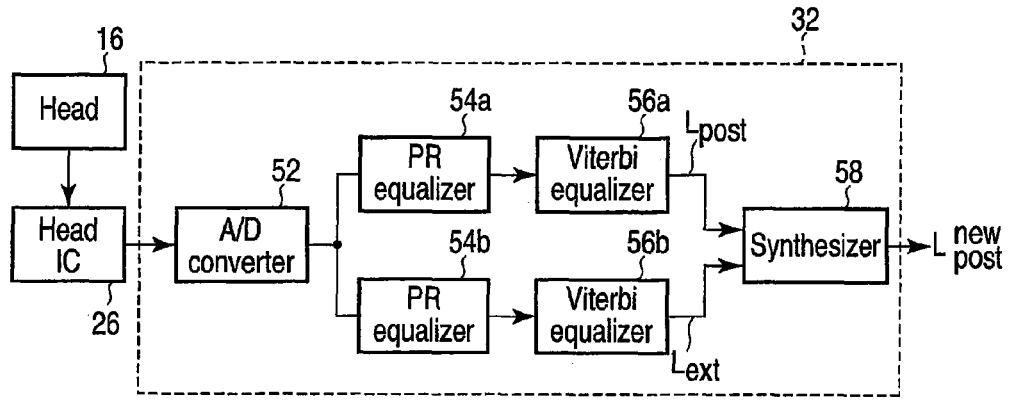
FIG. 2 is an exemplary chart illustrating a configuration of a reproduced signal processing circuit in a read/write block according to the first embodiment.

FIG. 2 is an exemplary chart illustrating a configuration of a reproduced signal processing circuit in the read/write block 32. An analog signal from the disk 12 is read by the head 16, and is amplified by the head IC 26. Then, the analog signal is supplied to an analog-to-digital converter 52. A digital signal output from the analog-to-digital converter 52 is supplied to Viterbi equalizers 56a and 56b via two different PR equalizers 54a and 54b. The PR equalizers 54a and 54b perform waveform equalization processing on input signals according to different PR targets (PR characteristics), and output PR signals representing PR responses. The Viterbi equalizers 56a and 56b have state transitions of the PR targets of the PR equalizers 54a and 54b. The Viterbi equalizers 56a and 56b receive PR signals (reproduced signal series) yk output from the PR equalizers 54a and 54b, perform Viterbi decode processing, and output hard decision values dk (these value are not actually used), an a log likelihood ratio $L_{post}$ of a posteriori probability value, and a log likelihood ratio $L_{ext}$ of an extrinsic value, which are soft decision values. The outputs of the Viterbi equalizers 56a and 56b are supplied to a synthesizer 58.

Among outputs from the Viterbi equalizer 56a, the log likelihood ratio $L_{post}$ of the posteriori probability value is supplied to the synthesizer 58. Among outputs from the Viterbi equalizer 56b, the log likelihood ratio $L_{ext}$ of an extrinsic value is supplied to the synthesizer 58. The synthesizer 58 multiplies both of them by appropriate weighting coefficients and adds up the multiplied values. The result of addition is adopted as a new log likelihood ratio $L^{new}_{post}$ the posteriori probability value. When this result of addition is subjected to hard decision, a reproduced signal series having a lower bit-error rate can be obtained.

For example, a recording/reproducing system is assumed to have a PR (h0, h1, h2, h3) characteristic. The variables in the parenthesis constitute an impulse response series. In other words, a sample value of a reproduced signal corresponding to a recorded bit "1" appears as a series having amplitudes of h0, h1, h2, and h3. An amplitude of a sample point outside of the above series is zero. The PR equalizers 54a and 54b include a finite impulse response (FIR) filter for modifying (equalizing) the reproduced signal provided from the head into a waveform according to a response waveform (partial response waveform signal) corresponding to a target PR characteristic (PR target). The amplification of a noise component caused by the equalization is reduced by selecting a PR characteristic similar to the signal characteristic of the recording/reproducing system.

The FIR filter may be based on different designs such as minimum mean square error (MMSE) and minimum bit-error rate.

Each of the Viterbi equalizers 56a and 56b includes a branch metric calculator, an addition/comparison/selection (ACS) circuit, a path memory, a path detection circuit, and a path metric memory. The branch metric calculator uses inputs from the PR equalizers 54a and 54b to perform branch metric calculation. The addition/comparison/selection circuit performs addition/comparison/selection between the output of the branch metric calculator and the path metrics stored in the path metric memory in order to detect a path and a path metric. The path memory stores a process of selection of a path. On the basis of the stored selection result, the path detection circuit detects a final decoded signal and outputs the signal.

The log likelihood ratio $L_{post}$ of the posteriori probability value and the log likelihood ratio $L_{ext}$ of the extrinsic value will be hereinafter explained in detail. In a case where, e.g., an equalizer using a maximum posteriori probability (max-log-MAP) algorithm and a Viterbi equalizer outputting a soft decision value are used, the likelihood ratio $L_{post}$ of the posteriori probability value output from the equalizer is represented by an equation (1).

$$L_{post} = \ln\frac{p(d_k = +1 \mid y)}{p(d_k = -1 \mid y)} \quad (1)$$

In the above equation, $d_k$ denotes information bit (+1 or −1) at a time k, and y denotes an input reproduced signal series. Where the states of a trellis diagram at times k, k−1 are defined as $s_k$, $s_{k-1}$, equation (1) can be transformed into equation (2).

$$L_{post} = \ln\frac{p(d_k = +1 \mid y)p(y)}{p(d_k = -1 \mid y)p(y)} \quad (2)$$

$$= \ln\frac{\sum_{(s_{k-1},s_k),d_k=+1} p(s_{k-1}, s_k, y)}{\sum_{(s_{k-1},s_k),d_k=-1} p(s_{k-1}, s_k, y)}$$

In the above equation, $p(s_{k-1}, s_k, y)$ denotes a reproduced signal series y and a transitional coupling probability from the state $s_{k-1}$ to the state $s_k$. In this case, where Markov property is assumed, $p(s_{k-1}, s_k, y)$ is represented as equation (3).

$$p(s_{k-1}, s_k, y) = p(s_{k-1}, y_1^{k-1})p(s_k, y_k \mid s_{k-1})p(y_k^K \mid s_k) \quad (3)$$

$$= \alpha_{k-1}(s_{k-1})\gamma_k(s_{k-1}, s_k)\beta_k(s_k)$$

In the above equation, $\alpha_{k-1}$, $\gamma_k$, and $\beta_k$ are defined as follows.

$$\alpha_{k-1}(s_{k-1}) = p(s_{k-1}, y^{k-1}) \quad (4)$$

$$\gamma_k(s_{k-1}, s_k) = p(s_k, y_k \mid s_{k-1}) \quad (5)$$

$$\beta_k(s_k) = p(y_k^K \mid s_k) \quad (6)$$

In the above equation, $y_i^j$ denotes a partial series from the i-th component to the j-th component.

Therefore, equation (2) can be represented by the following equation.

$$L_{post} = \ln\frac{\sum_{(s_{k-1},s_k),d_k=+1} \alpha_{k-1}(s_{k-1})\gamma_k(s_{k-1}, s_k)\beta_k(s_k)}{\sum_{(s_{k-1},s_k),d_k=-1} \alpha_{k-1}(s_{k-1})\gamma_k(s_{k-1}, s_k)\beta_k(s_k)} \quad (7)$$

In the above equation, $\gamma(s_{k-1}, s_k)$ can be represented as follows.

$$\gamma_k(s_{k-1}, s_k) = p(s_k, y_k \mid s_{k-1})p(s_k \mid s_{k-1})$$

$$= q(d_k \mid s_{k-1}, s_k)p(y_k \mid d_k)P(d_k)$$

However, where there is a transitional branch from the state $s_{k-1}$ to the state $s_k$ with respect to d=+1, −1, $q(d_k \mid s_{k-1}, s_k)$ is 1. Where there is no transitional branch, $q(d_k \mid s_{k-1}, s_k)$ is 0. On the other hand, $p(d_k)$ is priori information about $d_k$, and $p(y_k \mid d_k)$ represents a branch metric value of Viterbi algorithm in maximum likelihood decoding process. Therefore, based on equations (1) to (7), the log likelihood ratio $L_{post}$ of the posteriori probability value can be represented by the following equation.

$$L_{post} = \ln\frac{\sum_{(s_{k-1},s_k)} \alpha_{k-1}(s_{k-1})q(d_k = +1 \mid s_{k-1}, s_k)}{\sum_{(s_{k-1},s_k)} \alpha_{k-1}(s_{k-1})q(d_k = -1 \mid s_{k-1}, s_k)} \cdot \frac{p(y_k \mid d_k = +1)P(d_k = +1)\beta_k(s_k)}{p(y_k \mid d_k = -1)P(d_k = -1)\beta_k(s_k)} \quad (8)$$

$$= \ln\frac{P(d_k = 1)}{P(d_k = -1)} + \ln\frac{p(y_k \mid d_k = +1)}{p(y_k \mid d_k = -1)}$$

$$\ln\frac{\sum_{(s_{k-1},s_k)} \alpha_{k-1}(s_{k-1})q(d_k = +1 \mid s_{k-1}, s_k)\beta_k(s_k)}{\sum_{(s_{k-1},s_k)} \alpha_{k-1}(s_{k-1})q(d_k = -1 \mid s_{k-1}, s_k)\beta_k(s_k)}$$

Subsequently, the log likelihood ratio $L_{ext}$ of the extrinsic value is obtained by subtracting a log likelihood ratio $L_{app}$ of a priori value and a log likelihood ratio $L_{ch}$ of a branch metric value from the log likelihood ratio $L_{post}$ of the posteriori probability value. Therefore, the log likelihood ratio $L_{ext}$ of the extrinsic value can be represented by equation (9).

$$L_{ext} = L_{post} - L_{app} - L_{ch} \quad (9)$$

$$= \ln\frac{\sum_{(s_{k-1},s_k)} \alpha_{k-1}(s_{k-1})q(d_k = +1 \mid s_{k-1}, s_k)\beta_k(s_k)}{\sum_{(s_{k-1},s_k)} \alpha_{k-1}(s_{k-1})q(d_k = -1 \mid s_{k-1}, s_k)\beta_k(s_k)}$$

In this embodiment, when equalization is performed with two PR targets, the synthesizer 58 synthesizes the log likelihood ratio $L_{post}^1$ of the posteriori probability value output from the Viterbi equalizer 56a and the log likelihood ratio $L_{ext}^2$ of the extrinsic value output from the Viterbi equalizer 56b multiplied by a weight α, as shown in equation (10).

$$L_{post}^{new} = L_{post}^1 + \alpha L_{ext}^2 \quad (10)$$

When the output value of the synthesizer 58 is subjected to hard decision, a reproduced signal series having a lower bit-error rate can be obtained. The weight a of the synthesizer 58 may be set as a predetermined value according to empirical rule, or may be a value adjusted according to a state of a noise. For example, a retry may occur during recording, and in such occasion, an error rate is determined to be high, whereby the weight α is changed.

Figure 3:
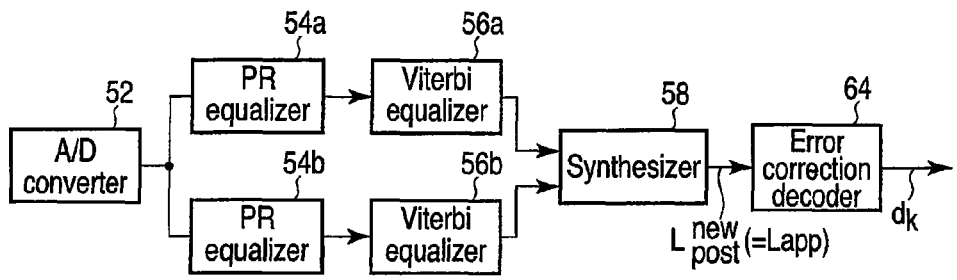
FIG. 3 is an exemplary chart illustrating a reproduced signal processing circuit according to a first modification of the first embodiment.

FIG. 3 illustrates a first modification of the first embodiment in which an error correction decoder 60 is arranged at an output stage subsequent to the Viterbi equalizer 56a, i.e. the synthesizer 58.

The synthesized signal $L_{post}^{new}$ output from the Viterbi equalizer 56a (i.e. the synthesizer 58) is input to the error correction decoder 60 at the subsequent stage as the log likelihood ratio $L_{app}$ of the priori value. For example, the error correction decoder 60 can be a turbo code decoder, a Low Density Parity Check code decoder, or a Reed Solomon Decoder using soft decision values $L_{post}^{new}$ as erasure information. Therefore, the bit-error rate can be greatly reduced.

Figure 4:
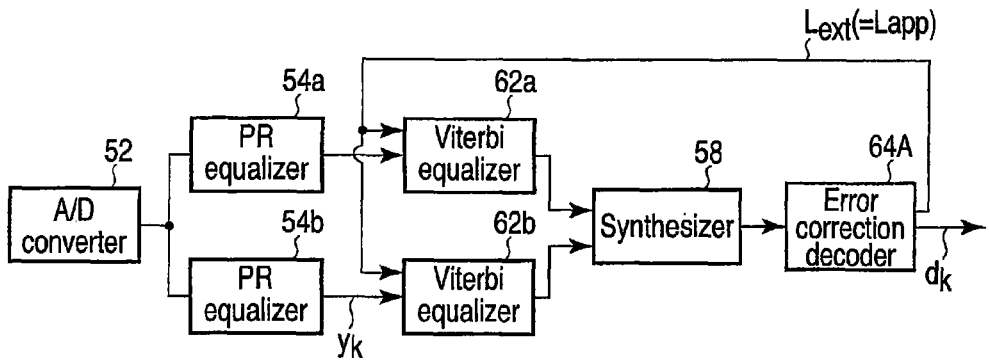
FIG. 4 is an exemplary chart illustrating a reproduced signal processing circuit according to a second modification of the first embodiment.

FIG. 4 illustrates a second modification of the first embodiment in which a decoder 64A is used as an error correction decoder to output a hard decision value $d_k$ and a soft decision value (the log likelihood ratio $L_{ext}$ of the extrinsic value). The Viterbi equalizers 62a and 62b receive the log likelihood ratio $L_{app}$ of the priori value and the reproduced signal, and output a hard decision value dk, the log likelihood ratio $L_{post}$ of the posteriori probability value, and the log likelihood ratio $L_{ext}$ of the extrinsic value. When the soft decision value (the log likelihood ratio $L_{ext}$ of the extrinsic value) output from the error correction decoder 64A is fed back to the Viterbi equalizers 62a and 62b as the log likelihood ratio $L_{app}$ of the priori value, the reliability of information can be enhanced, and the bit-error ratio can be further reduced due to the same principle as turbo code. In the turbo code, a very long codeword is generated by connecting two recursive systematic convolutional (RSC) encoders with an interleaver, and a decoder includes two decoders respectively supporting the RSC encoders. Accordingly, the decoding operation is efficiently performed by exchanging log likelihood ratios between the two decoders.

Figure 5:
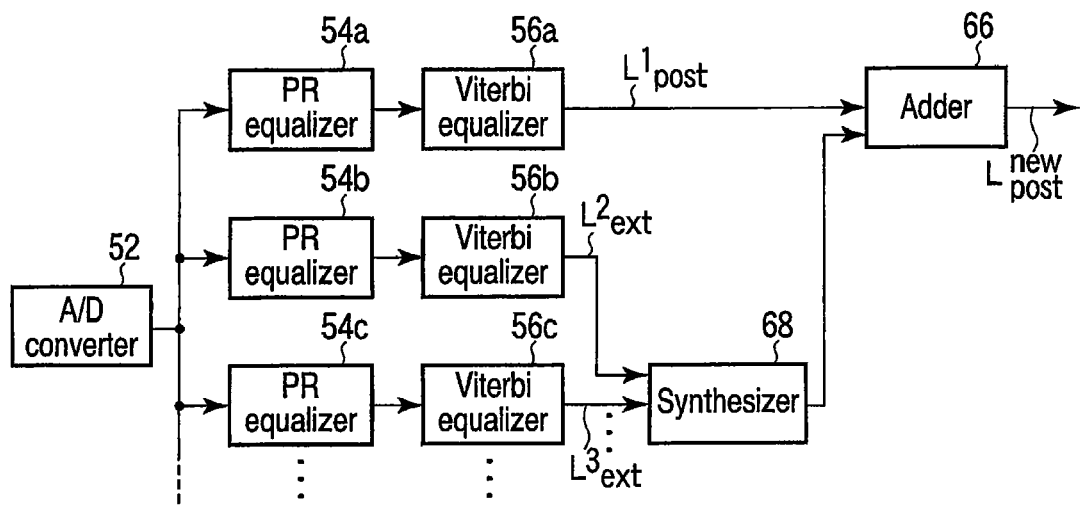
FIG. 5 is an exemplary chart illustrating a reproduced signal processing circuit according to a third modification of the first embodiment.

In the above explanation, there are two PR equalizers and two corresponding Viterbi equalizers. As shown in FIG. 5, N sets of PR equalizers and N sets of corresponding Viterbi equalizers may be prepared (N>1). FIG. 5 shows a modification of the example of FIG. 2. It is to be understood that, in FIGS. 3 and 4, N sets of PR equalizers and N sets of corresponding Viterbi equalizers may be prepared.

Among outputs from the Viterbi equalizer 56a, the log likelihood ratio $L_{post}$ of the posteriori probability value is supplied to an adder 66. Among outputs from the Viterbi equalizers 56b, 56c, . . . , the log likelihood ratios $L_{ext}$ of the extrinsic value are supplied to a synthesizer 68. The synthesizer 68 multiplies the log likelihood ratios $L_{ext}$ of the extrinsic value by an appropriate weight coefficient α and adds up the multiplied values. In other words, as shown in equation (11), the synthesizer 68 outputs a result of addition obtained by adding the log likelihood ratios $L_{ext}$ of the extrinsic value output from the second to the Nth Viterbi equalizer 56b, 56c, . . . multiplied by the weight a and the log likelihood ratio $L_{post}$ of the posteriori probability value output from the first Viterbi equalizer 56a.

$$L_{post}^{new} = L_{post}^1 + \sum_{n=2}^{N} \alpha_n L_{ext}^n \quad (11)$$

Subsequently, a method for efficiently selecting two different PR targets so as to reduce the bit-error rate will be explained. The log likelihood ratio $L_{post}$ of the posteriori probability value output from the first Viterbi equalizer 56a is used, and the log likelihood ratios $L_{ext}$ of the extrinsic value output from the second Viterbi equalizer 56b is used. A PR target of the first PR equalizer 54a is selected so as to achieve a large amount of mutual information of the log likelihood ratio $L_{post}$ of the posteriori probability value output from the Viterbi equalizer 56a. A PR target of the second PR equalizer 54b is selected so as to achieve a large amount of mutual information of the log likelihood ratio $L_{ext}$ of the extrinsic value output from the Viterbi equalizer 56b. Therefore, two appropriate PR targets can be selected without considering the combination.

Figure 6:
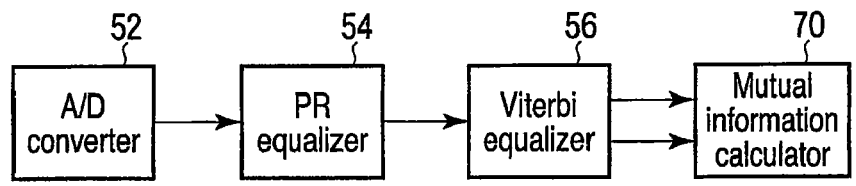
FIG. 6 is an exemplary chart illustrating a circuit configuration for selecting a PR target according to the first embodiment.

FIG. 6 is a processing configuration for calculating an amount of the mutual information for determining a PR target. An analog signal is reproduced by the head 16, and is amplified by the head IC 26. Then, the analog signal is input to the analog-to-digital converter 52 and is converted into a digital signal. The digital signal output from the analog-to-digital converter 52 is supplied to the PR equalizer 54 including any FIR filter, which performs PR equalization to make it into a target PR signal. The reproduced signal subjected to the PR equalization is input to the Viterbi equalizer 56 having a state transition of the PR target. The log likelihood ratio $L_{post}$ of the posteriori probability value and the log likelihood ratio $L_{ext}$ of the extrinsic value which are output from the Viterbi equalizer 56 are input to a mutual information calculator 70, and the mutual information thereof are calculated.

The mutual information of the log likelihood ratio $L_{post}$ of the posteriori probability value represents a value between 0 and 1 so as to indicate how much degree the information about the reproduced signal can be found from the log likelihood ratio $L_{post}$ of the posteriori probability value. Accordingly, this mutual information of the log likelihood ratio $L_{post}$ can be obtained by computing as follows. First, obtain a histogram of the log likelihood ratio $L_{post}$ of the posteriori probability value output from the Viterbi equalizer 56. Next, each probability density function of the log likelihood ratio $L_{post}$ of the posteriori probability value given the condition that the reproduced signal from the Viterbi equalizer 56 is +1 or −1, respectively, can be computed. Finally, the mutual information of the log likelihood ratio of $L_{post}$ is obtained by integrating the probability density functions as shown in equation (12).

Likewise, the mutual information of the log likelihood ratio $L_{ext}$ of the extrinsic value can also be calculated as shown in equation (13).

$$I(X; L_{post}) = \frac{1}{2} \sum_{d=\pm 1} \int_{-\infty}^{\infty} p(L_{post} \mid d) \log \frac{2p(L_{post} \mid d)}{p(L_{post} \mid d = +1) + p(L_{post} \mid d = -1)} dL_{post} \quad (12)$$

$$I(X; L_{ext}) = \frac{1}{2} \sum_{d=\pm 1} \int_{-\infty}^{\infty} p(L_{ext} \mid d) \log \frac{2p(L_{ext} \mid d)}{p(L_{ext} \mid d = +1) + p(L_{ext} \mid d = -1)} dL_{ext} \quad (13)$$

Therefore, with any PR target, the mutual information of the log likelihood ratio $L_{post}$ of the posteriori probability value and the mutual information of the log likelihood ratio $L_{ext}$ of the extrinsic value are obtained. The first PR target can be selected to achieve a large amount of the mutual information of the log likelihood ratio $L_{post}$ of the posteriori probability value. The second PR target can be selected to achieve a large amount of the mutual information of the log likelihood ratio $L_{ext}$ of the extrinsic value.

According to the first embodiment, two or more PR equalizers and two or more Viterbi equalizers are arranged for two or more different PR targets. The Viterbi equalization is performed for the two or more different PR targets. A synthesized value is obtained by adding the log likelihood ratio $L_{post}$ of the posteriori probability value output from the first Viterbi equalizer and the log likelihood ratio $L_{ext}$ of the extrinsic value output from the second and subsequent Viterbi equalizers. The synthesized value is regarded as a new log likelihood ratio of the posteriori probability value. Therefore, the bit-error rate can be reduced after the Viterbi equalization or the error correction.

Figure 7:
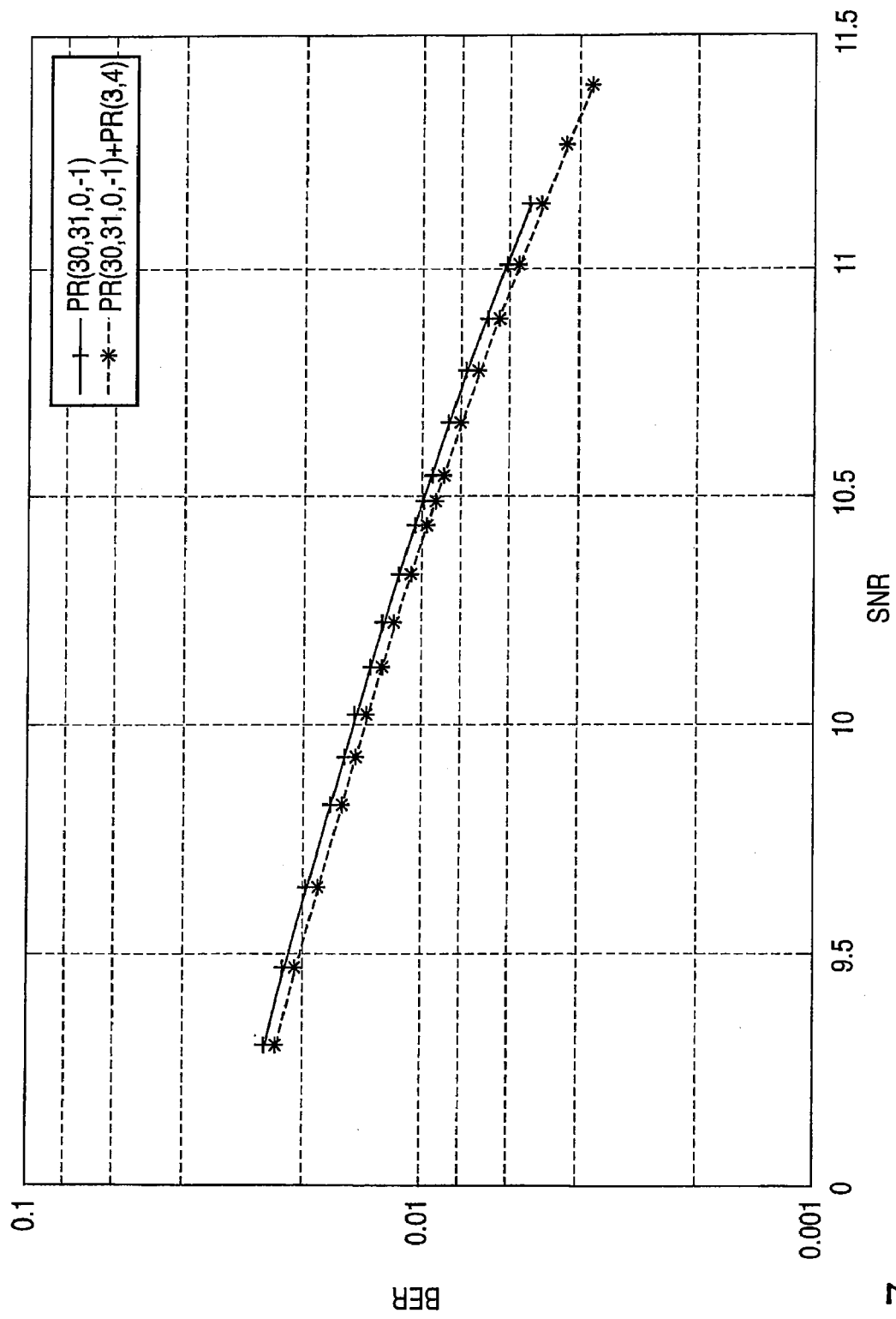
FIG. 7 is an exemplary chart illustrating improvement effect of bit-error rates with the signal processing circuit of FIG. 2.
Figure 8:
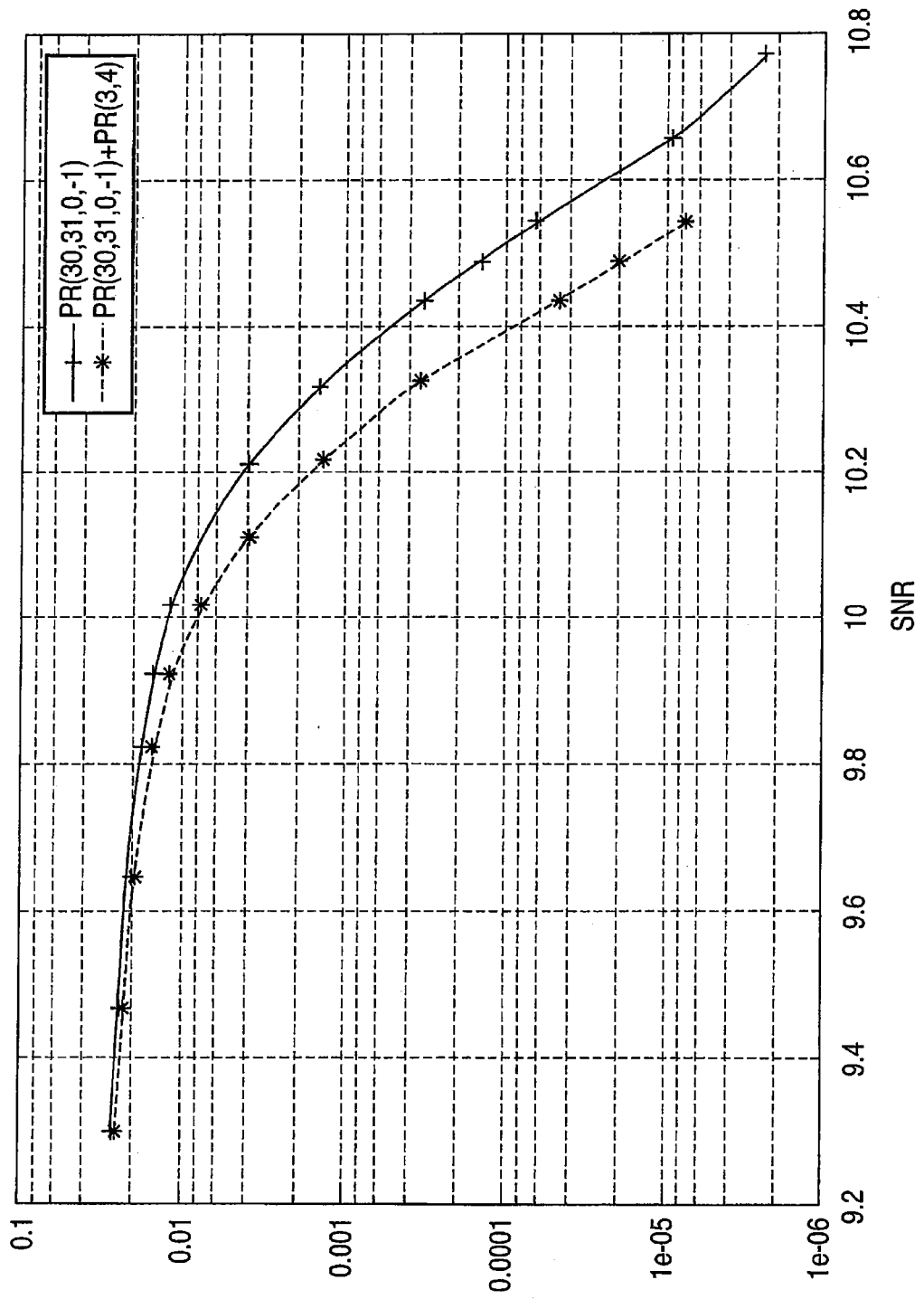
FIG. 8 is an exemplary chart illustrating improvement effect of bit-error rates with the signal processing circuit of FIGS. 3 and 4.

FIG. 7 illustrates improvement of the bit-error rate (BER) according to the first embodiment. The right side curve of FIG. 7 represents BER characteristics where there is only one PR equalizer and one Viterbi equalizer, whose PR target is PR (30, 31, 0, −1) with two AR tap coefficients. The AR tap coefficients are used for noise whitening. This noise whitening method is known as Autoregressive Maximum Likelihood (ARML). The left side curve on FIG. 7 represents the BER characteristic of the first embodiment in which there are two PR equalizers and two Viterbi equalizers, whose PR targets are PR(30, 31, 0, −1) with one AR tap coefficient and PR (3, 4) with three AR tap coefficients. BER is measured at the output of the Viterbi equalizers as shown in FIG. 2 without any error correction decoder. FIG. 8 represents BER improvement at the output of the error correction decoder according to the first embodiment (as shown in FIG. 4). PR target and AR tap coefficients are same as the ones used in FIG. 7. The error correction decoder is assumed to employ an LDPC decoder having a code rate of 0.93. As described above, it is understood that the first embodiment with an appropriate error correction decoder improves the bit-error rate BER by an order of magnitude when the SNR increases.

Second Embodiment

Figure 9:
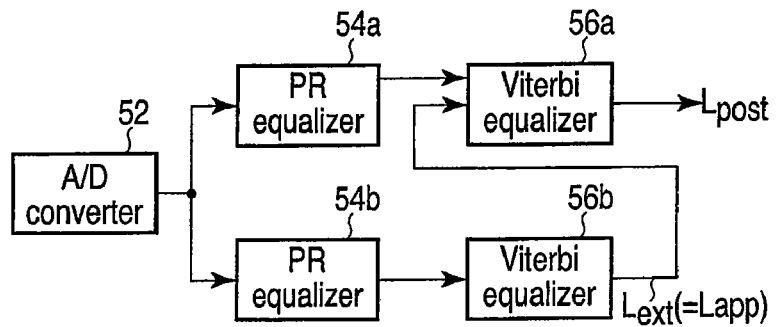
FIG. 9 is an exemplary chart illustrating a configuration of a reproduced signal processing circuit in a read/write block according to a second embodiment.
Figure 10:
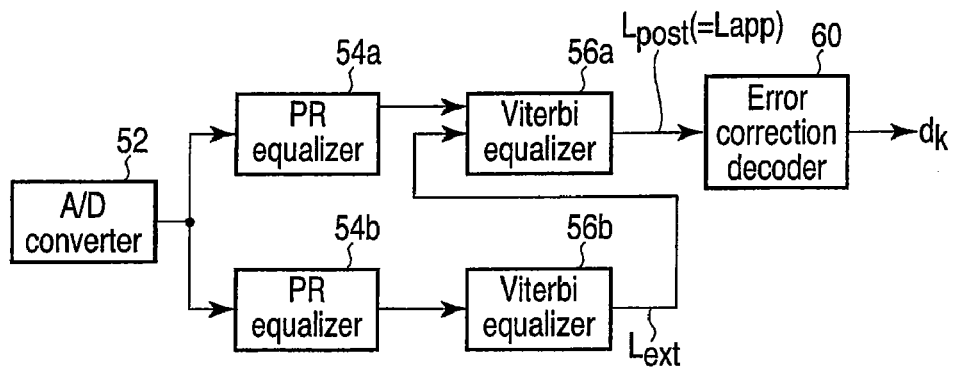
FIG. 10 is an exemplary chart illustrating a reproduced signal processing circuit according to a first modification of the second embodiment.
Figure 11:
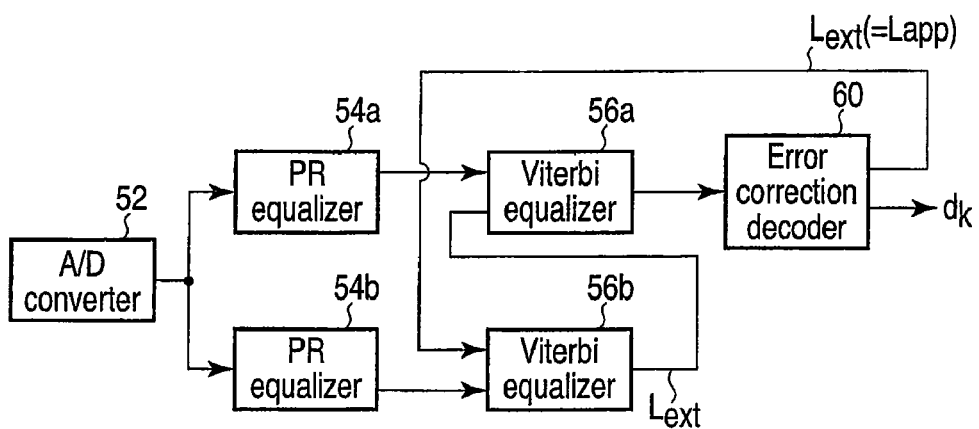
FIG. 11 is an exemplary chart illustrating a reproduced signal processing circuit according to a second modification of the second embodiment.

A reproduced signal processing circuit for performing equalization with two or more PR targets may also be configured as shown in FIG. 9. Like the first embodiment, the Viterbi equalizer 56b receives a reproduced signal series yk, and outputs a hard decision value dk (this value is not actually used), the log likelihood ratio $L_{post}$ of the posteriori probability value (this value is not actually used), and the log likelihood ratio $L_{ext}$ of the extrinsic value. The log likelihood ratio $L_{ext}$ of the extrinsic value output from the Viterbi equalizer 56b is multiplied by a weight α, and the multiplied value is input to the Viterbi equalizer 56a as an the log likelihood ratio $L_{app}$ of the priori value. The Viterbi equalizer 56a calculates a hard decision value dk (this value is not actually used), the log likelihood ratio $L_{post}$ of the posteriori probability value, and the log likelihood ratio $L_{ext}$ of the extrinsic value (this value is not actually used) from the reproduced signal series yk and the log likelihood ratio $L_{app}$ of the priori value. When the log likelihood ratio $L_{post}$ of the posteriori probability value output from the Viterbi equalizer 56a is subjected to hard decision, a reproduced signal series having a lower bit-error rate can be obtained.

Like the first embodiment, the second embodiment can also be modified. Like FIGS. 3 and 4, FIGS. 10 and 11 show modifications in which an error correction decoder is added to the second embodiment of FIG. 9. Like FIG. 5, FIG. 12 shows a modification obtained by modifying the second embodiment of FIG. 9. In the modification of FIG. 12, there are N sets of PR targets (N>1), and N sets of PR equalizers and N sets of corresponding Viterbi equalizers are provided (N>1). The log likelihood ratio $L_{ext}$ of the extrinsic value output from each of the second and subsequent Viterbi equalizers 56b, 56c, . . . is multiplied by the weight a, the multiplied value is input to a preceding Viterbi equalizer 56a, 56b, . . . as the log likelihood ratio $L_{app}$ of the priori value. This modification is the same as the above embodiment in that, even though the number of Viterbi equalizer increases, the log likelihood ratio $L_{post}$ of the posteriori probability value output from the first Viterbi equalizer 56a is subjected to hard decision.

Like the first embodiment, for example, the configuration of FIG. 6 is also used in the second embodiment to determine a PR target. The first PR target is selected so as to achieve a large amount of the mutual information of the log likelihood ratio $L_{post}$ of the posteriori probability value. The second or subsequent PR targets can be selected to achieve a large amount of the mutual information of the log likelihood ratio $L_{ext}$ of the extrinsic value. The equalization is performed using the selected targets. Further, the log likelihood ratio $L_{ext}$ of the extrinsic value output from each of the second and subsequent Viterbi equalizers is weighted, and the weighted value is input to a preceding Viterbi equalizer as the log likelihood ratio $L_{app}$ of the priori value. Therefore, the bit-error rate can be reduced after the Viterbi equalization or the error correction.

The above embodiments are applied to the magnetic recording/reproducing apparatus. Alternatively, the above embodiments can also be applied to an optical recording/reproducing apparatus such as a DVD, and further to a receiver apparatus for receiving and decoding a transmission signal transmitted in a transmission path.

According to the embodiments as described above, the signal processing device includes a first PR equalizer configured to perform a waveform equalization processing on a reproduced signal according to a first PR characteristic and to output a first PR signal, a second PR equalizer configured to perform a waveform equalization processing on the reproduced signal according to a second PR characteristic and to output a second PR signal, a first Viterbi equalizer configured to decode the output of the first PR equalizer by means of Viterbi decoding process, and a second Viterbi equalizer configured to decode the output of the second PR equalizer by means of Viterbi decoding process, wherein the input signal is reproduced based on the log likelihood ratio $L_{post}$ of the posteriori probability value output from the first Viterbi equalizer and the log likelihood ratio $L_{ext}$ of the extrinsic value output from the second Viterbi equalizer. As a result, an input signal can be restored with a lower bit-error rate.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A signal processing device comprising:
a first waveform equalizer configured to equalize a waveform of an input signal according to a first partial response characteristic and to output a first partial response signal;
a second waveform equalizer configured to equalize the waveform of the input signal according to a second partial response characteristic and to output a second partial response signal;

a first Viterbi decoder configured to decode the first partial response signal output from the first waveform equalizer by means of Viterbi decoding process; and a second Viterbi decoder configured to decode the second partial response signal output from the second waveform equalizer by means of Viterbi decoding process; and a synthesizer configured to perform weighting addition for a log likelihood ratio of a posteriori probability value output from the first Viterbi decoder and a log likelihood ratio of an extrinsic value output from the second Viterbi decoder, and wherein the input signal is reproduced based on an output of the synthesizer.

2. The device of claim 1, further comprising an error correction decoder comprising at least one of a turbo-code decoder and a low-density parity-check code decoder and configured to perform error correction decoding on the output of the synthesizer.

3. The device of claim 2, wherein the error correction decoder is configured to output the log likelihood ratio of the extrinsic value, and the log likelihood ratio of the extrinsic value is supplied to the first Viterbi decoder and the second Viterbi decoder as a log likelihood ratio of a priori value.

4. The device of claim 3, further comprising:

a third waveform equalizer configured to equalize the waveform of the input signal according to a third partial response characteristic and to output a third partial response signal;

a third Viterbi decoder configured to decode an output of the third waveform equalizer by means of Viterbi decoding process;

a synthesizer configured to perform weighting addition for the log likelihood ratio of the extrinsic value output from the second Viterbi decoder and a log likelihood ratio of an extrinsic value output from the third Viterbi decoder; and an adder configured to add the log likelihood ratio of the posteriori probability value output from the first Viterbi decoder and the output of the synthesizer, and wherein the input signal is reproduced based on an output of the adder.

5. The device of claim 2, further comprising:

a third waveform equalizer configured to equalize the waveform of the input signal according to a third partial response characteristic and to output a third partial response signal;

a third Viterbi decoder configured to decode an output of the third waveform equalizer by means of Viterbi decoding process;

a synthesizer configured to perform weighting addition for the log likelihood ratio of the extrinsic value output from the second Viterbi decoder and a log likelihood ratio of an extrinsic value output from the third Viterbi decoder; and an adder configured to add the log likelihood ratio of the posteriori probability value output from the first Viterbi decoder and the output of the synthesizer, and wherein the input signal is reproduced based on an output of the adder.

6. The device of claim 1, further comprising:

a third waveform equalizer configured to equalize the waveform of the input signal according to a third partial response characteristic and to output a third partial response signal;

a third Viterbi decoder configured to decode an output of the third waveform equalizer by means of Viterbi decoding process;

a synthesizer configured to perform weighting addition for the log likelihood ratio of the extrinsic value output from the second Viterbi decoder and a log likelihood ratio of an extrinsic value output from the third Viterbi decoder; and an adder configured to add the log likelihood ratio of the posteriori probability value output from the first Viterbi decoder and the output of the synthesizer, and wherein the input signal is reproduced based on an output of the adder.

7. A signal processing method comprising:

a first waveform equalization step of equalizing a waveform of an input signal according to a first partial response characteristic in order to output a first partial response signal;

a second waveform equalization step of equalizing a waveform of the input signal according to a second partial response characteristic in order to output a second partial response signal;

a first Viterbi-decoding step of decoding an output of the first waveform equalization step;

a second Viterbi-decoding step of decoding an output of the second waveform equalization step; and a synthesizing step of performing weighting addition for a log likelihood ratio of a posteriori probability value output of the first Viterbi step and a log likelihood ratio of an extrinsic value output of the second Viterbi decoding step; and wherein the input signal is reproduced based on an output of the synthesizing step.

8. The method of claim 7, further comprising an error correction decoding step of correcting the errors on an output of the synthesizing step, the error correction decoding step performing at least one of a turbo-code decoding and a low-density parity-check code decoding.

9. The method of claim 8, wherein the error correction decoding step is configured to output a log likelihood ratio of an extrinsic value, the first Viterbi-decoding step is configured to perform Viterbi-decoding using the log likelihood ratio of the extrinsic value as a log likelihood ratio of a priori value, and the second Viterbi-decoding step is configured to perform Viterbi-decoding using the log likelihood ratio of the extrinsic value as a log likelihood ratio of a priori value.

10. The method of claim 9, further comprising:

a third waveform equalization step of equalizing the waveform of the input signal according to a third partial response characteristic and to output a third partial response signal;

a third Viterbi decoding step of decoding an output of the third waveform equalization step;

a synthesizing step of performing weighting addition for the log likelihood ratio of the extrinsic value output of the second Viterbi decoding step and a log likelihood ratio of an extrinsic value output of the third Viterbi decoding step; and an adding step of adding the log likelihood ratio of the posteriori probability value output of the first Viterbi decoding step and the output of the synthesizing step, and wherein the input signal is reproduced based on an output of the adding step.

11. The method of claim 8, further comprising:
a third waveform equalization step of equalizing the waveform of the input signal according to a third partial response characteristic and to output a third partial response signal;
a third Viterbi decoding step of decoding an output of the third waveform equalization step;
a synthesizing step of performing weighting addition for the log likelihood ratio of the extrinsic value output of the second Viterbi decoding step and a log likelihood ratio of an extrinsic value output of the third Viterbi decoding step; and
an adding step of adding the log likelihood ratio of the posteriori probability value output of the first Viterbi decoding step and the output of the synthesizing step, and
wherein the input signal is reproduced based on an output of the adding step.

12. The method of claim 7, further comprising:
a third waveform equalization step of equalizing the waveform of the input signal according to a third partial response characteristic and to output a third partial response signal;
a third Viterbi decoding step of decoding an output of the third waveform equalization step;
a synthesizing step of performing weighting addition for the log likelihood ratio of the extrinsic value output of the second Viterbi decoding step and a log likelihood ratio of an extrinsic value output of the third Viterbi decoding step; and
an adding step of adding the log likelihood ratio of the posteriori probability value output of the first Viterbi decoding step and the output of the synthesizing step, and
wherein the input signal is reproduced based on an output of the adding step.

13. A signal reproducing apparatus comprising:
a head configured to read a signal from a disk storage medium;
a first waveform equalizer configured to equalize a waveform of an output signal from the head according to a first partial response characteristic and to output a first partial response signal;
a second waveform equalizer configured to equalize a waveform of the output signal from the head according to a second partial response characteristic and to output a second partial response signal;
a first Viterbi decoder configured to decode the first partial response signal output from the first waveform equalizer by means of Viterbi decoding process; and
a second Viterbi decoder configured to decode the second partial response signal output from the second waveform equalizer by means of Viterbi decoding process; and
a synthesizer configured to perform weighting addition for a log likelihood ratio of a posteriori probability value output from the first Viterbi decoder and a log likelihood ratio of an extrinsic value output from the second Viterbi decoder, and
wherein the signal from the disk storage medium is reproduced based on an output of the synthesizer.

14. The apparatus of claim 13, further comprising an error correction decoder comprising at least one of a turbo-code decoder and a low-density parity-check code decoder and configured to perform error correction decoding on the output of the synthesizer.

15. The apparatus of claim 14, wherein
the error correction decoder is configured to output the log likelihood ratio of the extrinsic value, and
the log likelihood ratio of the extrinsic value is supplied to the first Viterbi decoder and the second Viterbi decoder as a log likelihood ratio of a priori value.

16. The apparatus of claim 15, further comprising:
a third waveform equalizer configured to equalize the waveform of the input signal according to a third partial response characteristic and to output a third partial response signal;
a third Viterbi decoder configured to decode an output of the third waveform equalizer by means of Viterbi decoding process;
a synthesizer configured to perform weighting addition for the log likelihood ratio of the extrinsic value output from the second Viterbi decoder and a log likelihood ratio of an extrinsic value output from the third Viterbi decoder; and
an adder configured to add the log likelihood ratio of the posteriori probability value output from the first Viterbi decoder and the output of the synthesizer, and
wherein the input signal is reproduced based on an output of the adder.

17. The apparatus of claim 14, further comprising:
a third waveform equalizer configured to equalize the waveform of the input signal according to a third partial response characteristic and to output a third partial response signal;
a third Viterbi decoder configured to decode an output of the third waveform equalizer by means of Viterbi decoding process;
a synthesizer configured to perform weighting addition for the log likelihood ratio of the extrinsic value output from the second Viterbi decoder and a log likelihood ratio of an extrinsic value output from the third Viterbi decoder; and
an adder configured to add the log likelihood ratio of the posteriori probability value output from the first Viterbi decoder and the output of the synthesizer, and
wherein the input signal is reproduced based on an output of the adder.

18. The apparatus of claim 13, further comprising:
a third waveform equalizer configured to equalize the waveform of the input signal according to a third partial response characteristic and to output a third partial response signal;
a third Viterbi decoder configured to decode an output of the third waveform equalizer by means of Viterbi decoding process;
a synthesizer configured to perform weighting addition for the log likelihood ratio of the extrinsic value output from the second Viterbi decoder and a log likelihood ratio of an extrinsic value output from the third Viterbi decoder; and
an adder configured to add the log likelihood ratio of the posteriori probability value output from the first Viterbi decoder and the output of the synthesizer, and
wherein the input signal is reproduced based on an output of the adder.

* * * * *